United States Patent
Meneghesso et al.

(10) Patent No.: US 8,288,827 B2
(45) Date of Patent: Oct. 16, 2012

(54) FIELD EFFECT TRANSISTOR WITH METAL-SEMICONDUCTOR JUNCTION

(75) Inventors: Gaudenzio Meneghesso, Piovene Rocchette (IT); Fabio Alessio Marino, Conselve (IT)

(73) Assignee: Universita Degli Studi di Padova, Padua (IT)

( * ) Notice: Subject to any disclaimer, the term of this patent is extended or adjusted under 35 U.S.C. 154(b) by 397 days.

(21) Appl. No.: 12/526,310

(22) PCT Filed: Feb. 19, 2008

(86) PCT No.: PCT/EP2008/052005
§ 371 (c)(1), (2), (4) Date: Aug. 7, 2009

(87) PCT Pub. No.: WO2008/101926
PCT Pub. Date: Aug. 28, 2008

(65) Prior Publication Data
US 2010/0090281 A1  Apr. 15, 2010

(30) Foreign Application Priority Data
Feb. 23, 2007  (IT) .............................. MI2007A0353

(51) Int. Cl.
*H01L 21/02* (2006.01)
(52) U.S. Cl. ......... 257/382; 257/383; 257/384; 257/348
(58) Field of Classification Search .................. 257/288, 257/295, 335, 344–347, 368, 369, 407–409, 257/E29.271, E29.311, 382; 438/149, 231, 438/289, 372
See application file for complete search history.

(56) References Cited

U.S. PATENT DOCUMENTS

| | | | |
|---|---|---|---|
| 4,631,563 A * | 12/1986 | Iizuka ............................. 257/67 |
| 5,049,953 A * | 9/1991 | Mihara et al. ................. 257/409 |
| 6,630,385 B1 * | 10/2003 | Yu .................................. 438/289 |
| 7,589,381 B2 * | 9/2009 | Kinoshita et al. ............. 257/347 |
| 2005/0136607 A1 * | 6/2005 | Kim ............................... 438/305 |
| 2006/0040430 A1 * | 2/2006 | Xiong ............................ 438/149 |
| 2006/0081947 A1 * | 4/2006 | Mimura ......................... 257/407 |

* cited by examiner

*Primary Examiner* — Zandra Smith
*Assistant Examiner* — Errol Fernandes
(74) *Attorney, Agent, or Firm* — Bryan W. Bockhop; Bockhop & Associates, LLC

(57) ABSTRACT

A MOSFET transistor comprising a substrate of semiconductor material having a source junction connected to a source electrode, a drain junction connected to a drain electrode, and a gate layer connected to a gate electrode, the source junction or the drain junction being a metal-semiconductor junction.

5 Claims, 9 Drawing Sheets

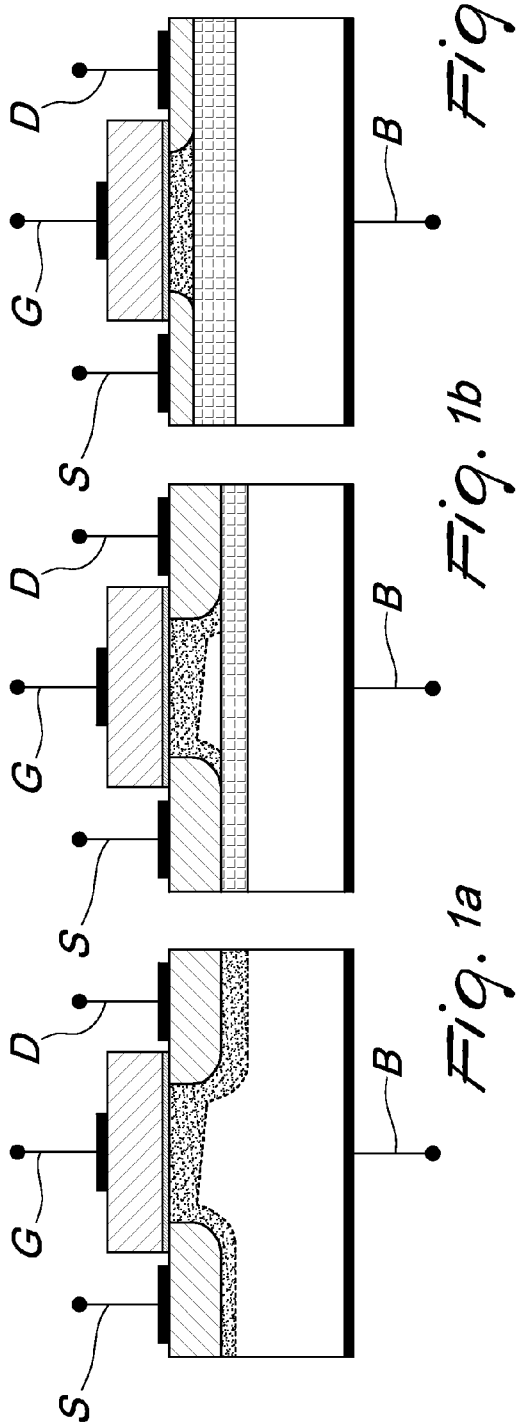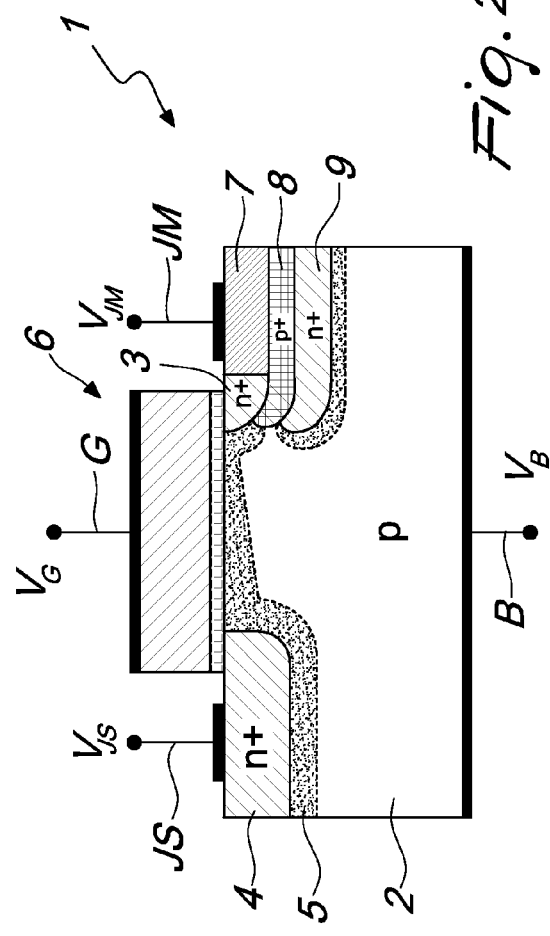

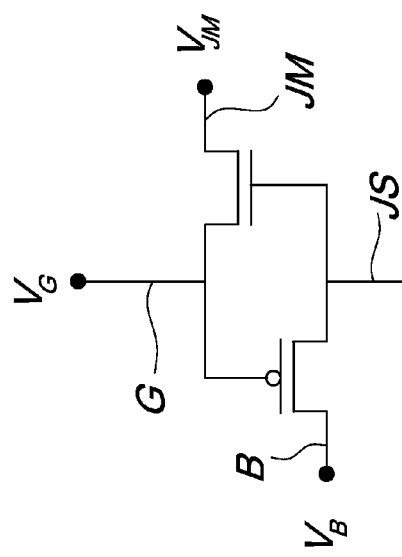
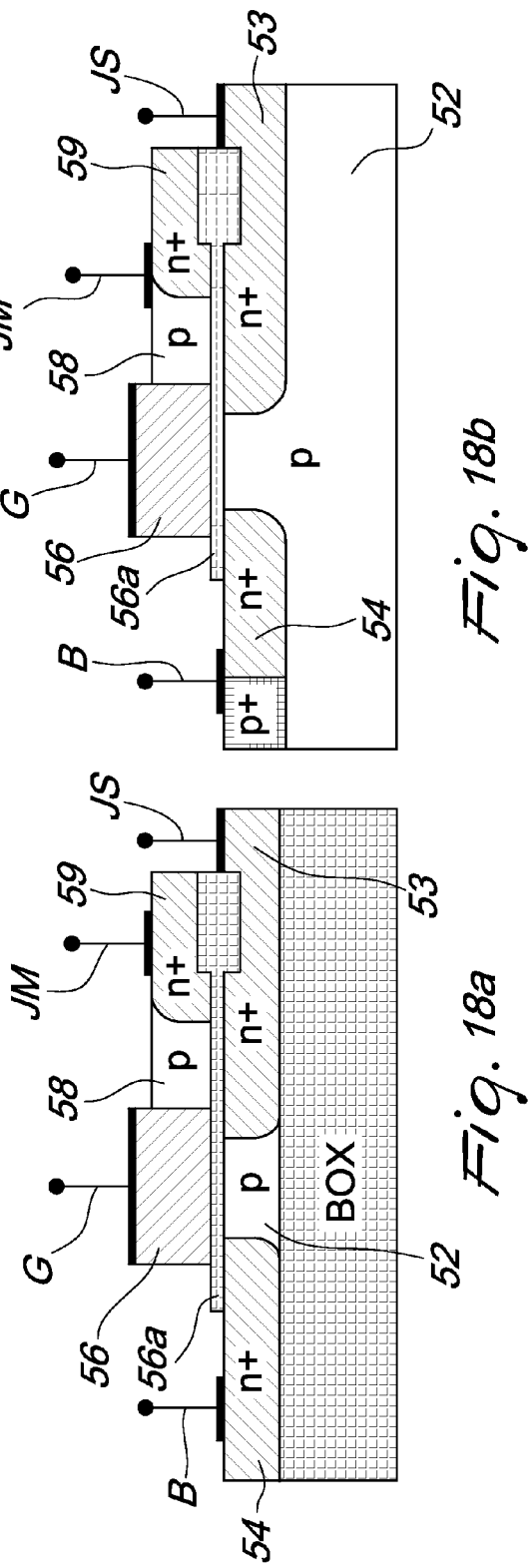
Fig. 17
Fig. 18a
Fig. 18b

FIELD EFFECT TRANSISTOR WITH METAL-SEMICONDUCTOR JUNCTION

TECHNICAL FIELD

The present invention relates to a field effect transistor with metal-semiconductor junction.

BACKGROUND ART

Field effect transistors ("FET") have completely replaced bipolar transistors, becoming the solid-state components most widely used in the production of integrated circuits (IC). FET transistors can in fact be provided with much smaller dimensions than bipolar transistors (BJT) and their production process is relatively simple. Further, the power consumption is lower than that of BJTs, especially at low frequencies.

The FET family comprises many mutually different devices. These devices can be divided mainly into three categories:
- Floating-gate MOSFETs (FGMOS—Floating Gate MOS);
- Bulk MOSFETs;
- SOI (Semiconductor On Insulator) MOSFETs.

The first are MOSFETs used in the production of nonvolatile memories, which are characterized by the property of being able to retain the stored information even in the absence of power supply voltages. Examples of memories which use FGMOSs are EPROMs, EEPROMs and Flash (with ETOX cell).

The second MOSFETs, also known as "conventional" (FIG. 1a), are the most widespread field effect transistors in the production of logic circuits and volatile memories such as SRAMs (Static Random Access Memory) and DRAMs (Dynamic RAM). This category includes enhancement MOSFETs and depletion MOSFETs, in which the device is built inside a semiconductor substrate and insulated from the others by means of inverse junctions.

Finally, SOI technology, is the latest evolution of the CMOS and consists in fabricating the MOS transistor in an insulating substrate (generally silicon oxide) known as BOX (Buried OXide).

There are several SOI structures. Among them, the fundamental ones are the "partially depleted" or PD SOI (FIG. 1b) and the "fully depleted" or FD SOI (FIG. 1c). Besides these devices, SOI technology allows to fabricate even more advanced configurations, such as double- and triple-gate devices.

As is known, when the voltage $V_{GS}$ between the gate and the source is higher than the threshold voltage $V_t$ and a voltage $V_{DS}>0$ is applied between drain and source, a current $I_{DS}$ flows from the drain to the source. If the $V_{DS}$ is low, this current can be expressed as:

$$I_{DS} = \mu_n C_{ox} \frac{W}{L}\left[(V_{GS} - V_t)V_{DS} - \frac{V_{DS}^2}{2}\right]$$

where: $\mu_n$ is the average mobility of the electrons in the channel;
$C_{ox}$ is the capacitance per unit area of the gate oxide;
W is the width of the MOSFET;
L is the length of the channel;
and $V_t$ is the threshold voltage.

For $V_{DS}=V_{GS}-V_t=V_{DSsat}$ (Saturation voltage), one has $V_{GD}=V_t$ and therefore the channel formed in the substrate at the interface with the gate oxide is pinched at the drain end (the phenomenon of pinch-off).

In these conditions, a more correct formula for $I_{DSsat}$, which takes into account this last remark as well, is the following:

$$I_{DSsat} = \frac{1}{2}\mu_n C_{ox}\frac{W}{L}(V_{GS} - V_T)^2(1 + \lambda V_{DS})$$

where $\lambda$ is a technological parameter, which depends on the fact that as $V_{DS}$ above $V_{DSsat}$, the pinch-off point shifts toward the source, reducing the actual channel length, reducing channel resistance and thus increasing $I_{DSsat}$ (an effect known as "channel length modulation").

In a bulk MOSFET, the threshold voltage depends on the bias of the substrate ("body" effect). As is known, the dependency of $V_t$ on the voltage between the substrate ("body") and the source $V_{BS}$ leads to a decrease of $I_{DS}$, $V_{DSsat}$ and $I_{DSsat}$, which become respectively:

$$I_{DS} = \mu_n C_{ox}\frac{W}{L}n\left[\frac{(V_{GS} - V_t)}{n}V_{DS} - \frac{V_{DS}^2}{2}\right]$$

$$V_{DSsat} = \frac{V_{GS} - V_t}{n}$$

$$I_{DSsat} = I_{DS}|_{V_{DS}=V_{DSsat}}(1 + \lambda V_{DS})$$
$$= \frac{1}{2}\mu_n C_{ox}\frac{W}{L}\frac{1}{n}(V_{GS} - V_t)^2(1 + \lambda V_{DS})$$

In order to model correctly current MOS devices, which are characterized by a short channel, i.e., shorter than 10 μm, it is not possible to resort to formulas for long channels such as the ones discussed above, but it is necessary to consider other secondary physical aspects, such as for example mobility degradation and velocity saturation.

As the electrons that constitute the drain current cross the channel, they are in fact deflected by the collisions they undergo when they encounter the surface or the acceptor atoms of the non-inverted substrate or when they collide with the thermal phonons generated by the vibrations of the lattice. Accordingly, the mobility of the carriers in the channel decreases as the transverse electrical field increases (mobility degradation) and their velocity, for high values of the longitudinal electrical field $E_y$, tends to settle at a limit value $v_{sat}$ known as "saturation velocity".

Therefore, the expressions cited above must be corrected so as to take into account the effective mobility of the carriers in the channel, which as is known is:

$$\mu_{eff} = \frac{\mu_0}{1 + (E_{eff}/E_0)^\nu}$$

where $\mu_0$, $E_0$ and $\nu$ are all fitting parameters and $E_{eff}$ is the average electrical field in the direction "x" which lies transversely to the channel, also known as "effective electrical field", which affects the free channel electrons. $E_{eff}$ is:

$$E_{eff} \cong \frac{1}{3t_{ox}}\left(\frac{V_{GS} + V_t}{2} - V_{FB} - 2/\phi_P/\right)$$

where $t_{ox}$ is the thickness of the gate oxide, $V_{FB}$ the so-called "flat-band voltage" and $|\phi_p|$ is the modulus of the potential of an electron in the p-type semiconductor.

In the SOI-PD MOSFET (FIG. 1b), the thickness of the layer of source silicon ($t_{Si}$) is greater than the maximum extension of the space charge region ($x_{d\ max}$).

Accordingly, below the depletion region there is always a neutral region which shields electrostatically the channel from the back-gate electrode (BG), i.e., from the substrate that lies below the BOX. Therefore, in the SOI-PD the threshold voltage does not depend on the back-gate potential. Moreover, the presence of the BOX makes the source-body and drain-body junction capacitances negligible.

The behavior of a SOI-PD is similar to the behavior of a conventional bulk MOSFET, but differently from said bulk MOSFET, since there is no body contact, it is affected by some additional parasitic effects known as "Floating Body Effects" (FBE). To eliminate these unwanted effects, it is possible to provide a body contact, obtaining a so-called "Body-Tied SOI" (BT SOI) MOS, which as is known can be provided with a single contact, double contact or multiple symmetrical contact.

If the substrate of a BT SOI transistor, instead of being permanently connected to the ground (nMOS) or to $V_{DD}$ (pMOS), is short-circuited with the gate, the device is known as "Dynamic Threshold MOSFET" (DT MOS). In this device, if $V_{GS}=V_{BS}$ increases, the threshold voltage decreases and therefore the channel current $I_{ch}$ increases. Further, since the body-source voltage $V_{BS}$ is equal to the collector-emitter voltage $V_{CE}$ the parasitic BJT formed by the source, body and drain, as the body potential increases, so does the collector current $I_C$. The combined effect of these two phenomena causes, therefore, a rapid increase in the total drain current.

Differently from the SOI PD MOSFETs discussed above, in Fully Depleted or FD SOI transistors (FIG. 1c) the thickness of the source silicon layer ($t_{Si}$) is lower than the maximum extension of the space charge region that is present in the substrate ($x_{d\ max}$).

Accordingly, in these devices the substrate is fully depleted for $V_{GS}=V_t$, independently of the bias applied to the back gate (except for a fine accumulation or inversion layer which can occur at the lower BOX/substrate interface, when the back-gate is biased by a high positive or negative voltage).

Fully Depleted SOIs, due to the absence of any neutral region in the substrate, are not affected by the floating body effects (at least as regards functional situations in which both front-gate and back-gate control electrodes have positive or no bias). Only three types of these particular MOSFETs are known: (i) the Single Gate SOI FD MOSFET (SG-MOS), in which $t_{BOX} \gg t_{ox}$ and the body, which acts as a mechanical support, is held to the ground; (ii) the Ground Plane SOI FD MOSFET (GP-MOS), where $t_{BOX} > t_{ox}$ and the back-gate is used to adjust the threshold voltage $V_T$; (iii) the Double Gate MOSFET (DG-MOS), where $t_{BOX}=t_{ox}$ and the two gates (FG and BG) are short-circuited.

Although, as shown, the evolution of MOS technology has led to devices which are increasingly less affected by secondary and parasitic phenomena, the corresponding applications are still limited by the inherent unidirectional nature of the operation of MOS transistors, which entails forced design choices in the integrated circuit.

This limitation also affects the number of transistors required to perform a certain function in integrated circuits, in particular in memories and in logic or sequential circuits.

DISCLOSURE OF THE INVENTION

The aim of the present invention is to overcome the drawbacks of the background art, by devising a single field-effect device which is capable of performing equally the functions of several transistors.

Within this aim, an object of the invention is to provide a device which allows to fabricate SRAM memory cells, combinatorial circuits and sequential circuits with a reduced number of transistors, increasing the integration density.

Another object of the invention is to provide a field-effect device which is highly reliable, relatively easy to provide and at competitive costs.

This aim and these and other objects, which will become better apparent hereinafter, are achieved by a MOSFET transistor comprising a substrate of semiconductor material having a source junction connected to a source electrode, a drain junction connected to a drain electrode and a gate layer connected to a gate electrode, characterized in that the source junction or the drain junction is a metal-semiconductor junction.

BRIEF DESCRIPTION OF THE DRAWINGS

Further characteristics and advantages of the invention will become better apparent from the following detailed description of a preferred but not exclusive embodiment of the device according to the invention, illustrated by way of non-limiting example in the accompany drawings, wherein:

FIGS. 1a, 1b and 1c are views of known MOSFETs of the bulk, SOI-PD and SOI-FD types, respectively;

FIG. 2 is a view of a double-halo nMOS WJM (DH WJM) structure according to a first embodiment of the invention;

FIG. 17 is a view of a circuit which is equivalent to the DT GDJ WJM pMOS of FIG. 16;

FIGS. 18a and 18b are views of structures of ST GDJ WJM nMOSs according to an eighth embodiment of the invention;

WAYS OF CARRYING OUT THE INVENTION

Figure 3:
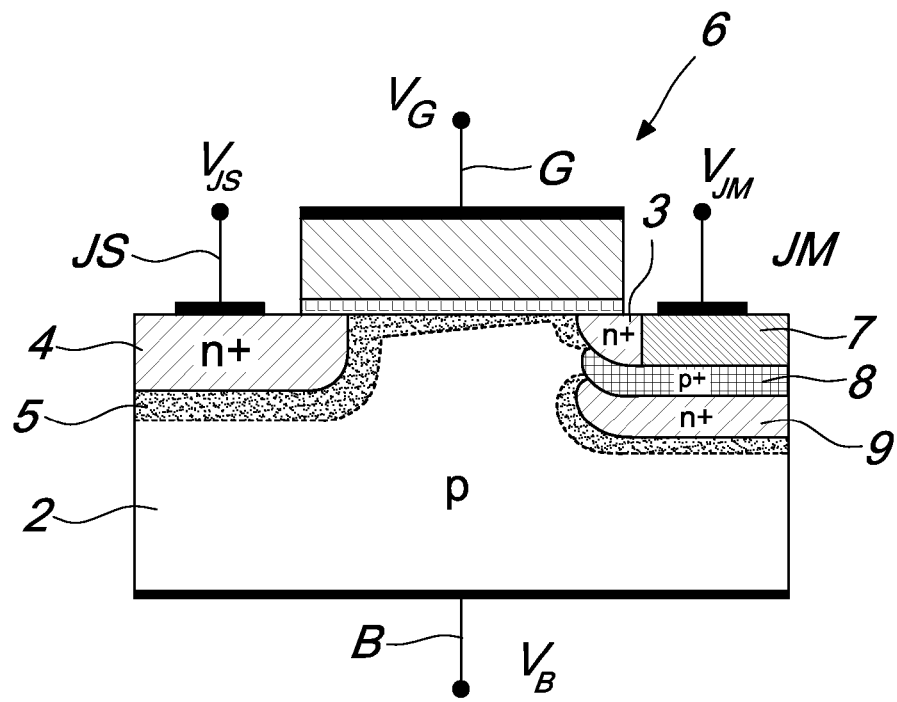
FIG. 3 is a view of the DH WJM MOS of FIG. 2 in which the gate terminal is at zero volts.

With reference to FIG. 2, a device according to a first embodiment of the invention, generally designated by the reference numeral 1, has a structure of a field-effect MOS transistor or, more briefly, MOSFET which comprises a substrate 2 of semiconductor material (preferably silicon) connected to a body electrode B and first and second regions 3 and 4, also made of semiconductor material (preferably silicon) and heavily doped, which are connected to respective electrodes JS and JM and are arranged so as to form respective drain and source junctions with the substrate 2. The junctions and a gate terminal produce, in the substrate 2, a space charge region 5.

In greater detail, the transistor 1 comprises a gate layer 6, composed of an insulating layer (preferably silicon oxide) and a control layer (for example of polysilicon), the latter being connected to a gate electrode G. The gate layer 6 is adapted to create, in the substrate 2 and in particular in the space charge region 5 at the interface with the insulating layer of the gate 6, a conduction channel enhanced with minority carriers when a certain voltage is applied between the gate electrode G and one of the two electrodes. This region of the substrate 2 in which a minority carrier channel is formed is also known as inversion region.

The particular embodiment of FIG. 2 shows the n-channel version of the transistor according to a first embodiment of the invention, in which the heavily doped regions to which the electrodes JS and JM lead are n+ doped and are obtained in the substrate 2, which is instead doped in the opposite manner, i.e., p doped.

The expression "heavily doped" is used abundantly in the semiconductor field to indicate a high concentration of dopants implanted in the semiconductor material, which is silicon in the preferred embodiments of the invention. Therefore, in the present description, the expression "heavily doped" shall correspond to conventional high dopant concentrations used in CMOS technology, for example 1 donor or acceptor atom for approximately every 10000 silicon atoms.

In the transistor 1, a first heavily doped region 3 forms a metal-semiconductor junction with a metallic region 7, which is arranged so as to form an ohmic contact with the channel, i.e., with the inversion region of the transistor 1 at the interface with the gate insulation layer. The electrode JM of the first region 3 is indeed connected to this metallic region 7.

In order to form an ohmic contact (i.e., a non-rectifying contact) with the channel, the metallic material of which the metallic region 7 is composed is chosen preferably so that it has a lower work function than n-doped silicon ($\Phi_{Sn}$), such as for example aluminum.

In the first embodiment of the invention, the transistor 1 further comprises at least one first halo 8 formed in the substrate 2 and heavily doped in the opposite manner with respect to the two regions 3 and 4, i.e., p+ doped in the example of FIG. 2. The metal-semiconductor junction 3-7 is formed above this first halo 8, so that the metallic region 7 is in ohmic contact (in the case being considered, ohmic tunnel contact) with the first halo 8. The particular arrangement of the metallic region 7 allows to mutually short-circuit the first heavily doped region 3 and the first halo 8.

Below the first halo 8, the transistor 1 further comprises a second layer of halo 9, which is heavily doped in the opposite manner with respect to the first halo 8 and with a dopant concentration which depends on the thickness of the second halo 9. In the case of an n-channel transistor 1, such as the one of FIG. 2, the doping of the second halo 9 is n+ if the second halo is thin, or n if it is thick.

It can be seen that the transistor of FIG. 2 is a normal bulk MOSFET in which the source junction (or the drain junction) is replaced by a multilayer 3-8-9 (n+/p+/n+) in which the first two layers 3 and 8 are short-circuited by means of the metallic region 7.

Due to the presence of two superimposed halos 8 and 9 with opposite doping, it is preferred to reference the transistor 1 according to the first embodiment of the invention as double-halo MOS WJM ("With Metal Junction") or DH MOS WJM.

Of course, it is possible to fabricate the dual version, i.e., the p-channel one, of the DH MOS WJM of FIG. 2, by inverting the dopings of the various layers of FIG. 2.

In order to understand better the behavior of the DH nMOS WJM transistor 1, the situation in which the terminal of the non-metallic junction JS ("Semiconductor Junction") is held at the supply voltage $V_{DD}$ and the substrate or body 2 is connected to the ground by means of the terminal B, is analyzed first.

In this situation, when the gate voltage $V_G$ is nil, the space charge region 5 that is present in the substrate 2 is very thin or even absent (FIG. 3).

Accordingly, the terminal of the metal-semiconductor junction JM ("Metal Junction") is connected to the substrate 2 by means of the first halo 8, which for this reason is referenced here as BCR (Body Contact Region). Therefore, for a nil gate voltage, the source (represented by the terminal JM) reaches a nil voltage, i.e., the voltage of the body 2. In such conditions, the transistor 1 is said to work under inverse operation.

Figure 4:
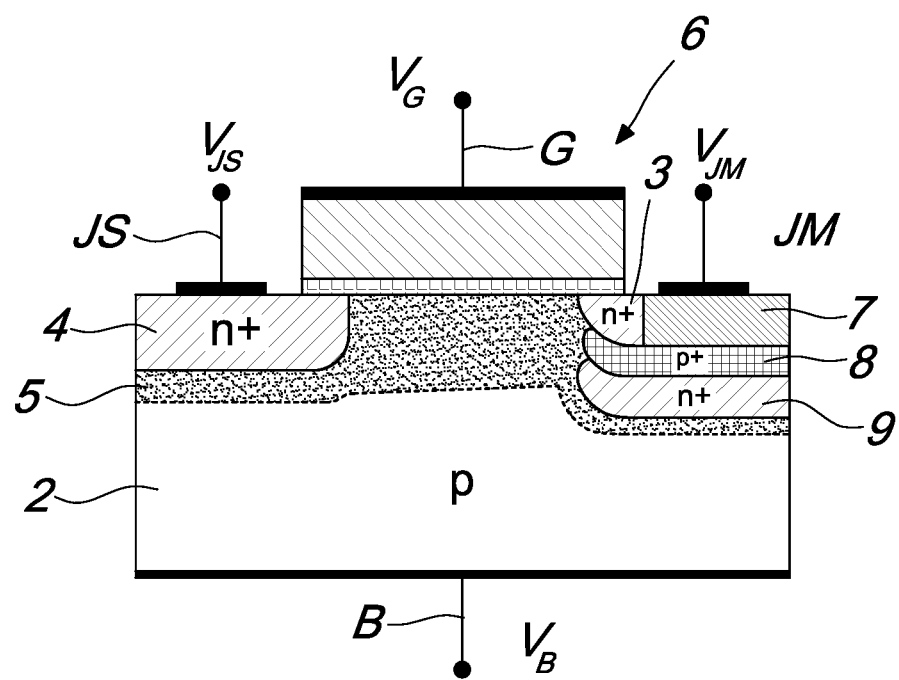
FIG. 4 is a view of the DH WJM MOS of FIG. 2 in which the voltage between the gate and the source is equal to a first threshold voltage $V_m$.

As the gate voltage $V_G$ increases, the space charge region 5 widens (FIG. 4) and the minority carrier channel begins to form below the oxide layer of the gate 6.

If the thickness $t_S$ of the multilayer formed by the first region 3 and by the first halo 8 is thin enough, for a voltage between the gate terminal G and the terminal JM equal to the threshold voltage ($V_{GS}=V_{tn}$), the width $x_d$ of the space charge region 5 is greater than $t_S$.

If this occurs, the first halo 8 or BCR, due to the space charge region that surrounds it, is isolated from the substrate 2 and the device behaves like a traditional nMOS. In fact, if $V_{GS}$ is increased beyond $V_{tn}$, the substrate 2 is depleted increasingly, the thickness of the channel increases and the voltage of the metallic electrode JM begins to rise.

Of course, in view of the nature of an nMOS, the highest value that the voltage of the source terminal JM can reach is $V_{JM}=V_S V_G-V_{tn}$.

If the non-metallic terminal JS, instead of being connected to $V_{DD}$, is held to the ground, for any gate voltage the terminal JM (which in this case acts as a drain terminal) remains at a nil voltage.

Figure 5:
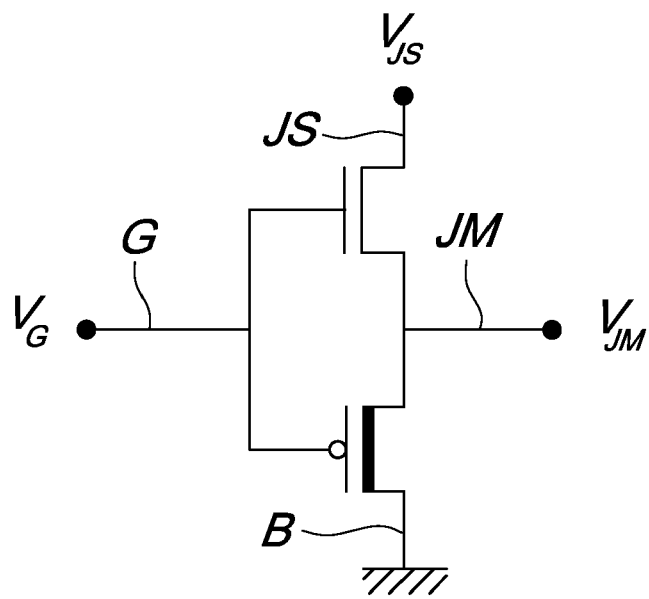
FIG. 5 is a view of the equivalent circuit of the DH WJM MOS of FIG. 2.

At the circuit level, the n-channel DH MOS WJM 1 can be likened to the circuit produced by the connection of two bulk MOSs, one of the enhancement n-channel type and one of the p-channel depletion type, in which the drains are connected respectively to a voltage $V_{JS}$ and to the ground and with their gates mutually short-circuited, as shown in FIG. 5. If $V_{JS}=V_{DD}$, then the voltage $V_{JM}$ in fact follows the voltage $V_G$ minus the threshold voltage. If instead $V_{JS}=0$, $V_{JM}$ remains at zero for any gate voltage $V_G$.

Figures 7A, 7B:
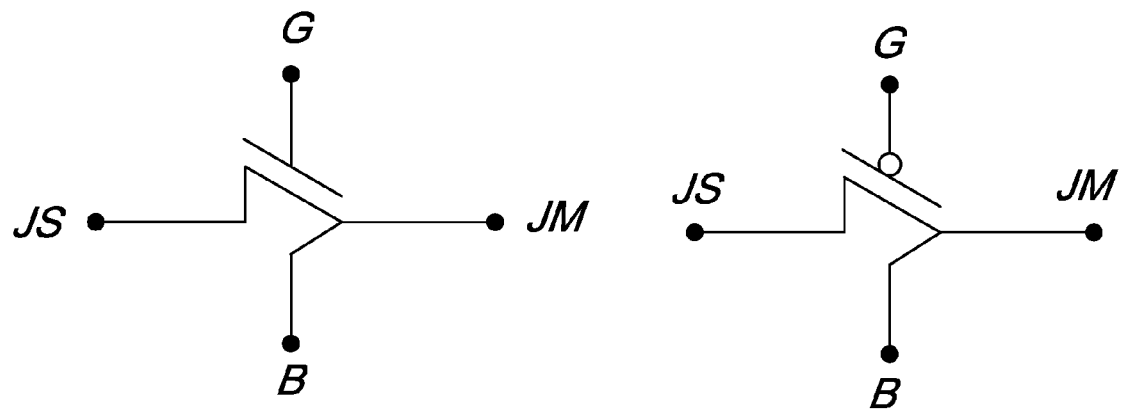
FIGS. 7a and 7b are preferred circuit symbols for the n-channel and p-channel version of the DH WJM MOS according to the first preferred embodiment of the invention.

On a practical level, it is preferred to use the circuit symbols shown in FIGS. 7a and 7b, which are representative of the fact that the transistor according to the invention is a single device, i.e., can be fabricated entirely substantially in the same substrate area that would be occupied by a conventional bulk MOSFET.

Figure 6:
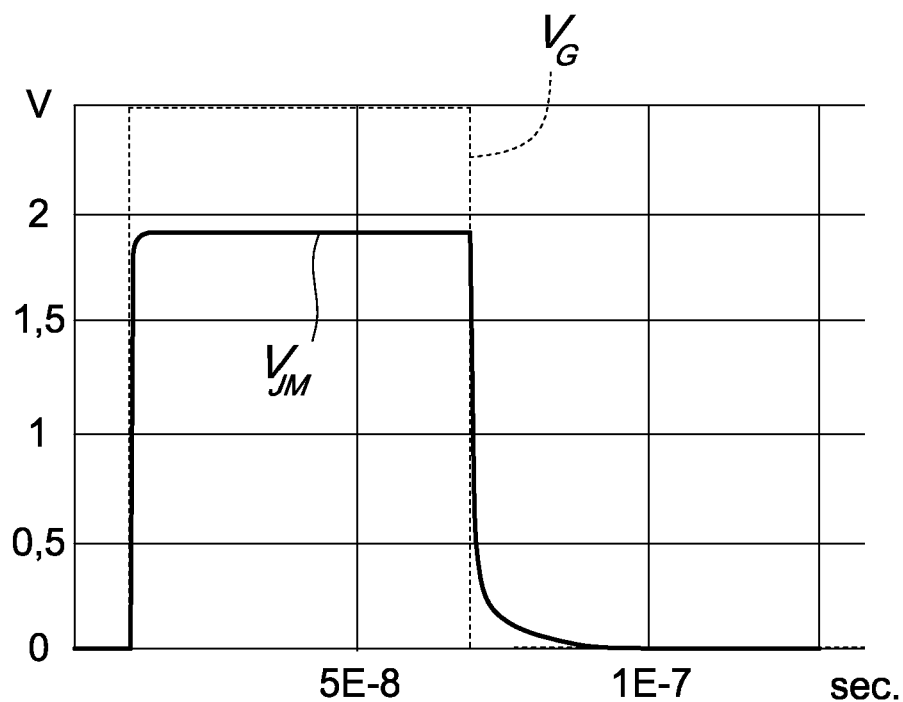
FIG. 6 plots the response $V_{JM}$ of the DH WJM MOS of FIG. 4 to a rectangular pulse applied to the gate.

FIG. 6 plots the voltage $V_{JM}$ an n-channel DH MOS WJM with the terminal JS connected to $V_{DD}$, in response to a rectangular signal applied to the gate. As can be seen, the shape of the voltage of the metallic source JM follows the rectangular shape of the gate voltage, both on the rising front and on the falling front. Instead, in a traditional bulk nMOS such as the one of FIG. 1a, the source voltage does not follow the gate voltage on the falling front of the rectangular signal, but settles substantially on the value reached during the rising step.

In an n-channel DH MOS WJM, as can be deduced from the equivalent circuit of FIG. 5, there are two threshold voltages $V_{ti}$ and $V_{tn}$ depending on whether one is working, respectively, under inverse operation or under normal operation.

The first threshold voltage ($V_{ti}$) represents the value that the gate voltage must reach for the first halo 8, and in particular the region of the first halo that makes contact with the substrate 2, to be completely isolated from the substrate 2. The second threshold voltage ($V_{tn}$), instead, refers to the value of $V_{GS}$ which the channel forms below the gate oxide.

The definition allows to deduce that $V_{ti}$ is the voltage $V_{GS}$, so that the extent $x_d$ of the space charge region 5 present in the substrate 2 is equal to the thickness $t_S$ of the multilayer formed by the first region 3 and by the first halo 8, i.e.:

$$V_{ti}=V_{GS}|_{x_d=t_S}.$$

It can be seen that for $V_{GS} \geq V_{ti}$, $$V_{GS}-V_{FB}=V_{ox}+V_{RCS}$$

where $V_{FB}$ the flat-band voltage, while $V_{ox}$ and $V_{RCS}$ are, respectively, the voltage drop across the oxide layer of the gate 6 and of the space charge region 5 in the substrate 2 and have, as is known, the following values:

$$V_{ox} = -\frac{Q_D}{C_{ox}} = \frac{qN_A x_d}{C_{ox}},$$

$$V_{RCS} = \frac{x_d^2 q N_A}{2\varepsilon_S},$$

where $N_A$ is the concentration of dopants in the substrate 2. One obtains therefore:

$$V_{ti} = V_{GS}|_{x_d=t_S}$$
$$= V_{FB} + V_{RCS}|_{x_d=t_S} + V_{ox}|_{x_d=t_S} =$$
$$= V_{FB} + \frac{t_S^2 q N_A}{2\varepsilon_S} + \frac{qN_A t_S}{C_{ox}}$$
$$= V_{FB} + qt_S N_A \left(\frac{t_S}{2\varepsilon_S} + \frac{1}{C_{ox}}\right)$$

The threshold voltage under normal operation can instead be expressed with the conventional formula:

$$V_{tn} = V_{FB} + 2|\phi_P| + \frac{1}{C_{ox}}\sqrt{2\varepsilon_S qN_A(2|\phi_P|+V_{SB})}$$

One can therefore conclude that if $$t_S < (x_{d\,max})_{min} = x_{d\,max}|_{V_{SB}=0}$$

i.e., if $$t_S < \sqrt{\frac{2\varepsilon_S 2|\phi_F|}{qN_A}},$$

for $V_{GS} < V_{ti}$ the transistor 1 works under inverse operation, whereas for $V_{GS} > V_{tn}$ it works under normal operation. Finally, for $V_{ti} < V_{GS} < V_{tn}$ the transistor 1 is in cut-off mode.

It should be noted that if the condition cited above occurs on the thickness $t_S$, then the first threshold voltage $V_{ti}$ is always lower than the second threshold voltage $V_{tn}$.

As regards the value of the currents, it can be noted that if the transistor 1 works under normal operation, the metallic terminal JM is completely isolated from the body 2.

Accordingly, for $V_{GS} > V_{tn}$, the calculation of the currents is similar to the one that would be performed in a conventional bulk MOS, such as the one of FIG. 1a.

Therefore, for $0 < V_{DS} < (V_{GS}-V_{tn})/n$, one finds that:

$$I_{DS} = \mu_n C_{ox} \frac{W}{L} n \left[\frac{(V_{GS}-V_{tn})}{n} V_{DS} - \frac{V_{DS}^2}{2}\right]$$

whereas for $V_{DS} > (V_{GS}-V_{tn})/n$, one has a saturation current equal to:

$$I_{DSsat} = I_{DS}|_{V_{DS}=V_{DSsat}}(1+\lambda V_{DS})$$
$$= \frac{1}{2}\mu_n C_{ox} \frac{W}{L}\frac{1}{n}(V_{GS}-V_{tn})^2(1+\lambda V_{DS})$$

If instead the transistor 1 works under inverse operation, it is possible to calculate that the body current of the transistor 1, if $V_{GS} > V_{FB}$, has substantially the following value:

$$I_{SB} = \mu_p C_{ox}\frac{W}{L}\gamma'\left[(V_{GS}-V_{ti})V_{BS}+\frac{1}{2}V_{BS}^2\right][1+\lambda'(V_{GS}-V_{ti}+V_{BS})]$$

where $V_{BS}$ is the body-source voltage.

If instead $V_{GS} < V_{FB}$, the device 1 is in the "inverse triode" mode and the body current can be calculated as follows:

$$I_{SB} = \mu_p C_{ox}\frac{W}{L}\gamma''\left[(V_{GS}-V_{ti}+V_{RCSt})V_{BS}+\frac{1}{2}V_{BS}^2\right]$$
$$[1+\lambda''(V_{GS}-V_{ti}+V_{RCSt}+V_{BS})]$$

where $V_{BS}$ the body-source voltage and $V_{RCSt}$ is the voltage that drops across the space charge region for $V_{GS}=V_{ti}$.

The p-channel version of the DH MOS WJM is provided in an n-type substrate with "p" and "n" regions swapped with respect to the structure of FIG. 2. This component works in the same manner as the n-channel transistor 1, except that the threshold voltage under normal operation $V_{tn\,p}$ and the threshold under inverse operation $V_{ti\,p}$ become respectively:

$$V_{tn\,p} = V_{FB} - 2/\phi_n / - \frac{/Q_D/}{C_{ox}}$$

$$V_{tip} = V_{FB} - qt_S N_D \left( \frac{t_S}{2\varepsilon_S} + \frac{1}{C_{ox}} \right)$$

As regards instead the drain and body currents, it is possible to calculate that:

for $V_{GS} < V_{tn\,p}$ and $V_{DS} > V_{GS} - V_{tn\,p'}$ $$I_{SD} = \mu_p C_{ox} \frac{W}{L} \left[ (V_{GS} - V_{tn\,p}) V_{DS} - \frac{V_{DS}^2}{2} \right]$$

for $V_{GS} < V_{tn\,p}$ and $V_{DS} < V_{GS} - V_{tn\,p'}$ $$I_{SDsat} = \frac{1}{2} \mu_p C_{ox} \frac{W}{L} (V_{GS} - V_{tn\,p})^2 (1 + \lambda_p V_{DS})$$

for $V_{ti\,p} < V_{GS} < V_{FB'}$ $$I_{BS} = \mu_n C_{ox} \frac{W}{L} \gamma'_p \left[ (V_{GS} - V_{tip}) V_{BS} + \frac{1}{2} V_{BS}^2 \right]$$
$$= [1 + \lambda'_p (V_{GS} - V_{tip} + V_{BS})]$$

for $V_{GS} > V_{FB'}$ $$I_{BS} = \mu_n C_{ox} \frac{W}{L}$$

$$\gamma''_p \left[ (V_{GS} - V_{tip} + V_{RCSt}) V_{BS} + \frac{1}{2} V_{BS}^2 \right] [1 + \lambda''_p (V_{GS} - V_{tip} + V_{RCSt} + V_{BS})]$$

The transistor 1 according to the first embodiment can be modified by using an SOI structure. In particular, with reference to the second embodiment of the invention, shown in FIG. 8, the DH nMOS WJM transistor 10 comprises a buried layer 11 of BOX insulation, which is arranged in contact with the region 4 (JS) and with the first halo 8.

Figure 8:
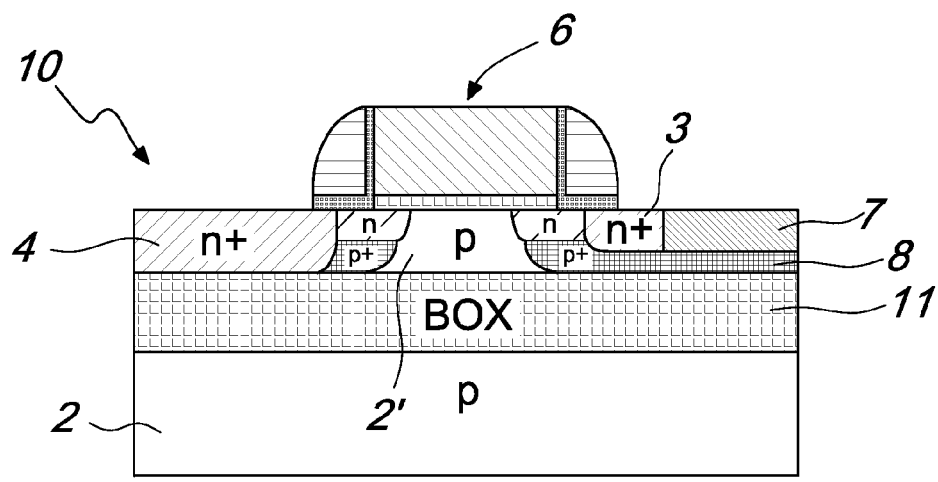
FIG. 8 is a view of a DH WJM SOI MOS structure according to a second embodiment of the invention.

At the substrate regions adjacent to the drain and source junctions 3, 4, the transistor 10 can comprise lightly doped regions LDD (Light Diffusion Drain), shown in FIG. 8 with n doping. The regions LDD are irrelevant in terms of the operation of the invention, but are formed typically to allow a gradual drain junction, reducing the electrical field proximate to the drain electrode. The regions LDD can be present in all the substrates of the transistors according to the invention, at the junctions with heavily doped regions, but for reasons of simplicity they have been omitted in the figures.

In FIG. 8, the various doped regions of the transistor 10 are designated by the same reference numerals of FIG. 2, the materials, the dopings and the relative positions of the various regions being identical with respect to the first embodiment 1.

The structure of the DH SOI nMOS WJM 10 of FIG. 8 is similar to that of a Body-Tied SOI in which one of the two p+ halos is short-circuited with an n+ junction.

The drain currents and the threshold voltages are similar to the ones already calculated for the DH MOS WJM 1 of FIG. 2. The only difference can be seen in the body current under inverse operation, which is no longer forced to pass through the deepest region of the substrate 2 as occurs instead in the transistor 1 of FIG. 2. It is possible to calculate that this current, respectively in ohmic mode and in inverse triode mode, assumes approximately the following values in the SOI version:

$$I_{SB} = \mu_p C_{ox} k_\Gamma \gamma' \left[ (V_{GS} - V_{ti}) V_{BS} + \frac{1}{2} V_{BS}^2 \right];$$

$$I_{SB} = \mu_p C_{ox} k_\Gamma \gamma'' \left[ (V_{GS} - V_{ti} + V_{RCSt}) V_{BS} + \frac{1}{2} V_{BS}^2 \right]$$

$$k_\Gamma = \frac{(L'' - L')W}{W^2 - (L'' - L')^2} \log \left[ \frac{W'W - L''(L'' - L')}{W(W' - W) - L'} \right];$$

where: L is the distance between the nearest ends of the two contacts JM and JS;

W is the width of the region of JM/JS;

(W',L') and (W',L'') are respectively the lower and upper ends of the body contact;

(W'-W) and (L''-L') are, respectively, the length and the width of the substrate region comprised between the body contact and the channel region.

The approximations of these current values in ohmic mode and inverse triode mode are obtained by assuming that the substrate 2, seen from above, is equivalent to the parallel arrangement of N infinitesimal conductances (with N→∞) (arranged at right angles between the body contact B and the JM contact), each having the following value:

$$G_L = \sigma_S \left[ \frac{dx}{y} // \frac{dx}{(W-x)} \right] = \sigma_S \frac{dy}{\frac{W'L'}{L''-L'} + y \left[ \frac{(L''-L')}{W'} + \frac{W'}{L''-L'} \right]}$$

where $\sigma_S$ is the conductivity per unit area of the substrate 2, while x is the direction of extension of the body contact, perpendicular to the direction y along which the contacts JM and JS are aligned.

In the n-channel version of the transistor according to the first and, especially, the second embodiment of the invention, the conductivity of the substrate and its control can be improved considerably if, instead of an n+ doped polysilicon gate (i.e., doped like the two regions 3 and 4), one uses metal with a higher work function than n doped silicon ($\Phi_{Sn}$) or if one even uses polysilicon with inverse doping, i.e., p+ instead of n+. In this case, the transistor can be identified by means of the acronym GID (Gate Inverse Doping), in order to differentiate it from the others.

In a GID transistor, the substrate can be doped even just weakly, thus increasing the mobility $\mu_n$ of the carriers in normal operation. Under inverse operation, the MOS structure is under accumulation, forming a true p channel below the gate and thus allowing better control over the concentration of holes.

Similar reasoning can be followed for the p-channel version of the WJM structure of FIGS. 2 and 8.

A third embodiment of the invention is now described with reference to FIG. 9. The third embodiment, designated herein also as GDC ("Gate Double Control") WJM, has a field effect MOS transistor structure 30 which comprises a substrate 20 of semiconductor material on which two regions 13 and 14 are provided which are heavily doped in the opposite manner with respect to the substrate doping.

The substrate 20 is connected to a body electrode B through one of the two heavily doped regions 14 and further comprises a buried layer BOX 21, provided below the two heavily doped regions 13 and 14.

Figure 9:
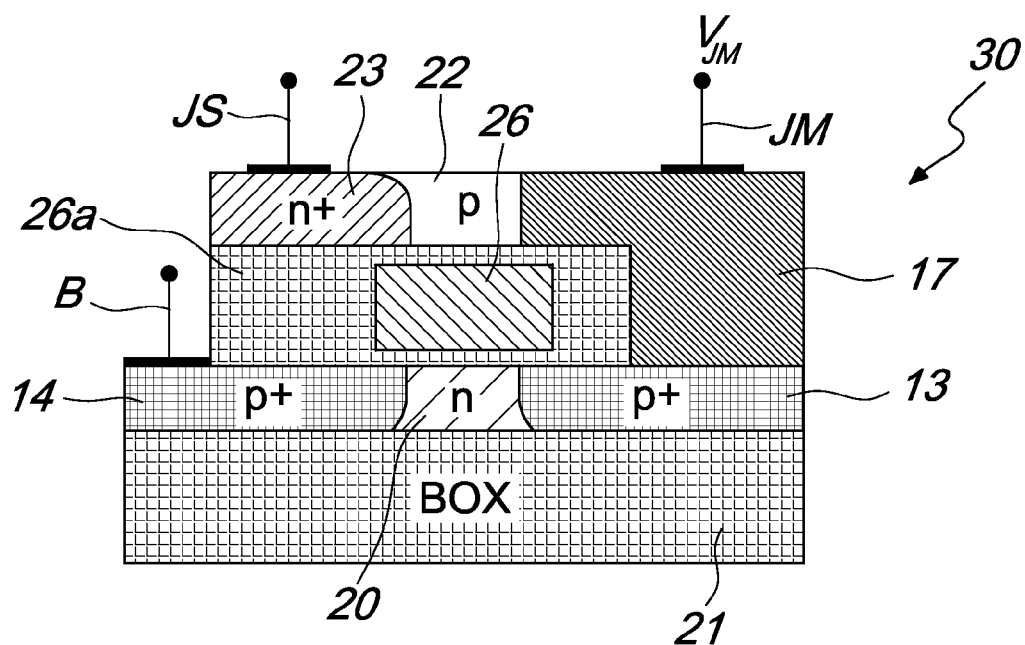
FIG. 9 is a view of a WJM pMOS structure with double gate control (WJM GDC) of the SOI type, according to a third embodiment of the invention.

In the p-channel version shown in FIG. 9, the substrate 20 is n doped and the two regions 13 and 14 are provided on the substrate 20 so as to be at a mutual distance and are p+ doped. The second region 14 is the one connected to the body electrode B.

The GDC WJM transistor 30 further comprises a gate control layer 26 connected to a gate electrode (not shown) and arranged on the substrate 20 in the region comprised between the two regions 13 and 14, so as to create, in the substrate 20 and in particular in the region comprised between the two regions 13 and 14, an enhanced conduction channel for minority carriers when a certain voltage is applied between the gate electrode and one of the two regions 13 or 14, as in a conventional bulk MOS structure.

The gate control layer 26 is buried in an insulator 26a (for example silicon oxide) on which the source and drain junctions of the transistor 30 are deposited. In particular, a semiconductor junction 22-23 is deposited on the gate insulator 26a and comprises a respective electrode JS and a metal-semiconductor junction 22-17, which comprises in its metallic part 17 an electrode JM.

In greater detail, the semiconductor junction 22-23 and the metal-semiconductor junction 22-17 are formed with a same third region 22 of semiconductor material and doped in the opposite manner to the substrate 20 (therefore p doped in the case of FIG. 9). The third region 22 is aligned with the gate control layer 26 and with the region of the substrate 20 comprised between the two regions 13 and 14.

Moreover, the junction 22-23 is completed with a fourth region 23, which is heavily doped in the opposite manner with respect to the doping of the two regions 13 and 14 (therefore n+ doped, in the case of FIG. 9) and connected to the electrode JS.

Finally, the metal-semiconductor junction 22-17 is formed between the third region 22 and a metallic region 17, arranged so as to connect directly the first region 13 of the substrate 20 to the third region 22 of the semiconductor junction arranged above the gate layer. The metallic region forms an ohmic contact (in the case considered, a tunnel ohmic contact) with the first region 13 and a Schottky (rectifying) contact with the third region 22.

Thanks to the structure thus defined, a difference in potential applied between the electrode JM or JS and the gate electrode provides a channel in the third region 22.

As can be noticed, from the manufacturing standpoint the device 30 is a conventional p-type FD SOI on which semiconductor material (for example silicon) has been grown epitaxially and has been subsequently doped so as to form the junction (drain or source junction, depending on the bias) 22-23 and provided with holes to allow the deposition of the metallic region 17 over a first heavily doped (p$^+$) region 13.

The operating principle of the transistor 30 of FIG. 9 is rather simple. If the gate electrode is set to zero, the pMOS structure formed by the two regions 13 and 14 and by the substrate 20 switches on, and the metallic terminal JM reaches the same voltage as the body terminal B. If instead the gate terminal is placed at the supply voltage $V_{DD}$, a conducting n-type channel forms in the junction 22-23 arranged above the gate layer 26-26a, and connects electrically the electrode JM to the electrode JS.

Therefore, the metallic region 17 of the GDC transistor 30 is alternately connected to two conduction channels, which can be obtained below and above the gate layer 26-26a by applying suitable voltages to the gate electrode.

Figure 11A:
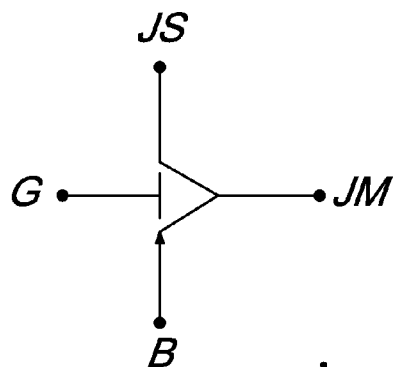
FIGS. 11a and 11b are preferred circuit symbols for an n-channel and p-channel GDC WJM MOS, respectively.
Figure 11B:
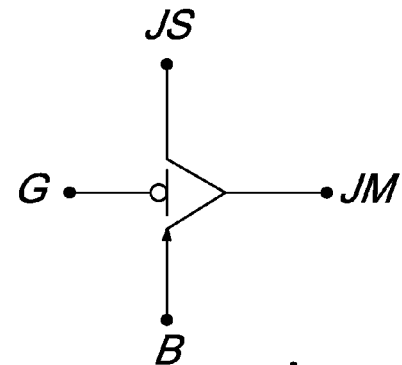

At the electrical level, the GDC transistor of FIG. 9 can be represented as in FIG. 11b (or as in FIG. 11a in the case of the n-channel version). This transistor is equivalent to a DH MOS WJM (FIG. 5), with the difference that the body terminal B of FIG. 9 can be brought either to the supply voltage $V_{DD}$ or to zero, without risking the switching-on of the parasitic diodes. Further, again in terms of circuit equivalence, the pMOS which is the equivalent of the GDC MOS WJM 30 is not of the depletion type like the one of FIG. 5, but of the enhancement type.

In this case, both the threshold voltages and the currents are those of a conventional FD SOI MOSFET. The threshold voltage under normal operation is in fact:

$$V_{tn\,p} = V_{FB\,down} - 2/\phi_n / -\frac{/Q_{D\,down}/}{C_{ox\,down}}$$

where all the parameters are referred to the lower pMOS structure ("down" subscript), i.e., to the structure formed by the regions 13, 14 and 20.

Under inverse operation, the threshold voltage is:

$$V_{ti\,p} = V_{FB\,up} + 2/\phi_p / +\frac{/Q_{D\,up}/}{C_{ox\,up}}$$

where all the parameters are referred to the upper structure ("up" subscript) formed by the junction 22-23.

As regards the currents, if the body terminal B is placed at the voltage $V_{DD}$ and the terminal JS is connected to the ground, the drain currents can be calculated, obtaining the following results:

for $V_{GS}<V_{tn\,p}$ and $V_{DS}>V_{GS}-V_{tn\,p}$, one is in normal triode mode:

$$I_{DS} = -\mu_p C_{ox\,down} \frac{W}{L_{down}} \left[ (V_{GS} - V_{tn\,p})V_{DS} - \frac{V_{DS}^2}{2} \right]$$

for $V_{GS}<V_{tn\,p}$ and $V_{DS}<V_{GS}-V_{tn\,p}$, one is in the normal saturation mode:

$$I_{DS} = -\frac{1}{2}\mu_p C_{ox\,down} \frac{W}{L_{down}} (V_{GS} - V_{tn\,p})^2$$

for $V_{GS}>V_{ti\,p}$ and $V_{DS}<V_{GS}-V_{ti\,p}$, the transistor 30 works in inverse triode mode:

$$I_{DS\,i} = \mu_n C_{ox\,down} \frac{W}{L_{up}} \left[ (V_{GS} - V_{ti\,p})V_{DS\,i} - \frac{V_{DS\,i}^2}{2} \right]$$

for $V_{GS}>V_{ti\,p}$ and $V_{DS}>V_{GS}-V_{ti\,p}$, one is in "inverse saturation" mode:

$$I_{DS\,i} = \frac{1}{2}\mu_n C_{ox\,up} \frac{W}{L_{up}} (V_{GS} - V_{ti\,p})^2$$

where the subscripts "DS" and "DS i" refer respectively to the lower structure (13, 14, 20) and to the upper structure (22, 23, 17) and the other symbols have the meaning used conventionally for channel length/width, oxide capacitance, minority carrier mobility, and so forth.

Figure 10:
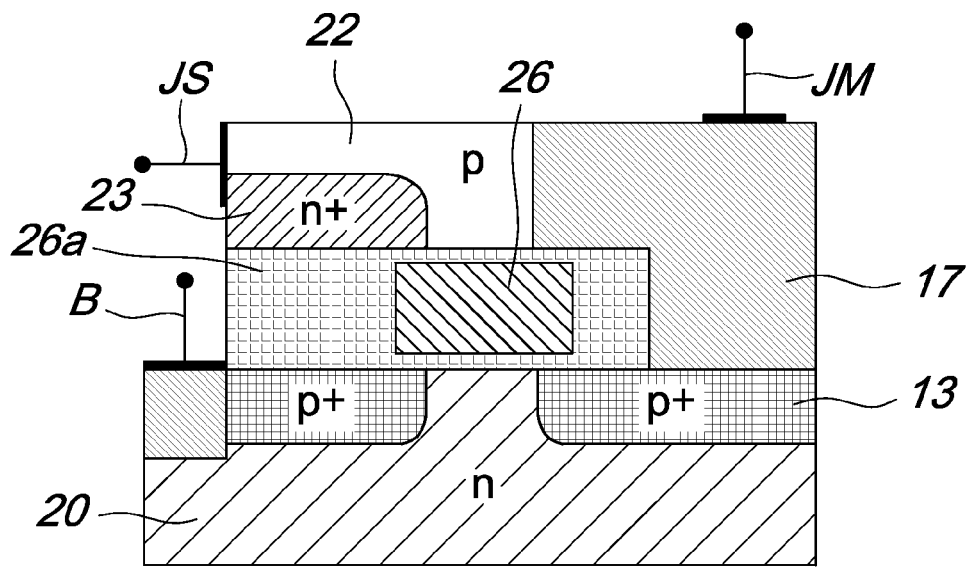
FIG. 10 is a view of a non-SOI GDC WJM MOS structure, according to a fourth embodiment of the invention.

It should be noted that the GDC MOS WJM 30 can also be fabricated with a non-SOI structure, as shown in the fourth embodiment of FIG. 10. However, in this structure the body terminal B and the terminal JS must be preferably held, respectively, at the supply voltage $V_{DD}$ and to the ground, in order to avoid switching on the parasitic diodes. As an alternative, one can choose to provide a Fully Depleted structure only in the upper MOS structure (22-23).

Of course, the dual and hybrid versions of both devices of FIGS. 9 and 10, obtained by inverting the dopings, also exist. It should be noted that the term "n-channel" or "p-channel" used in the present description refers to the lower structures.

Figure 12:
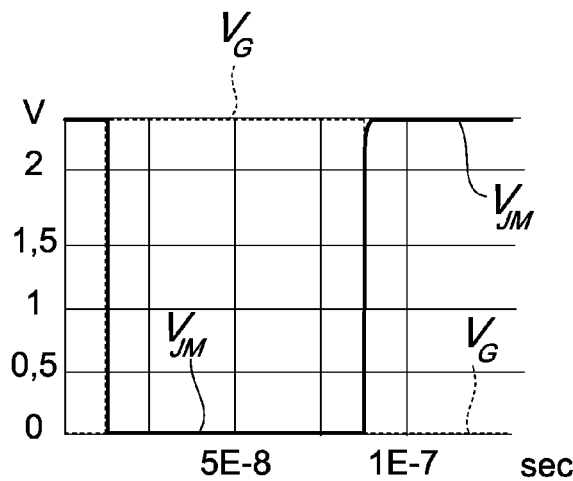
FIG. 12 plots the voltage $V_{JM}$ of an n-channel GDC WJM MOS with terminals JS and B connected respectively to $V_{DD}$ and to the ground, in response to a rectangular signal applied to the gate.

FIG. 12 plots the voltage $V_{JM}$ the dual version of the transistor 30, i.e., the voltage $V_{JM}$ of an n-channel GDC MOS WJM, in which the terminals JS and B are connected, respectively, to the supply voltage $V_{DD}$ and to the ground, in response to a rectangular signal $V_G$ applied to the gate electrode. As for the DH WJM transistor 1, it can be noted that the voltage of the electrode JM follows (in inverted form) the input voltage and changes state at the rising and falling fronts of the rectangular gate signal.

Figure 13:
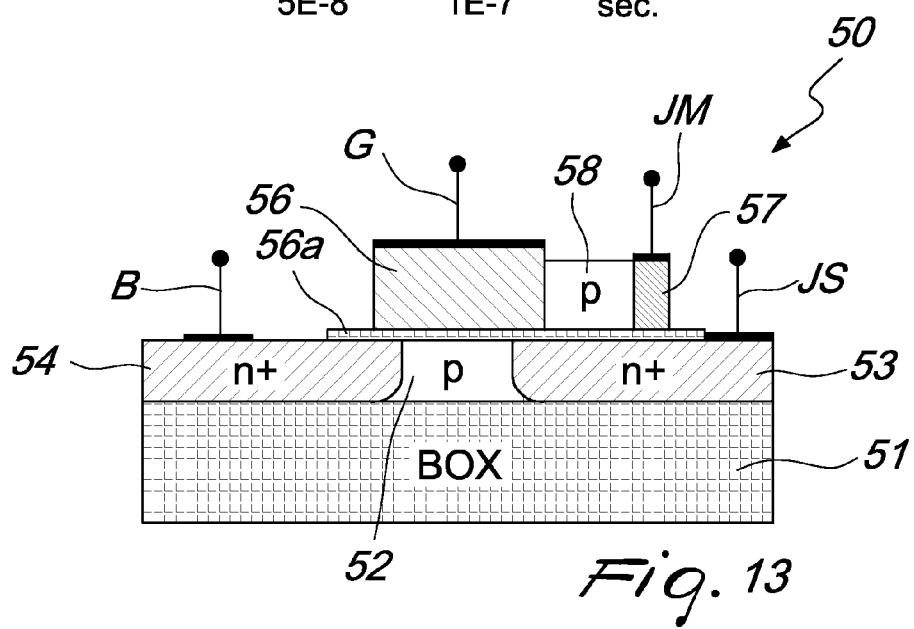
FIG. 13 is a view of a structure of a WJM nMOS with gate-diode junction (WJM GDJ), of the SOI type, according to a fifth embodiment of the invention.
Figure 15:
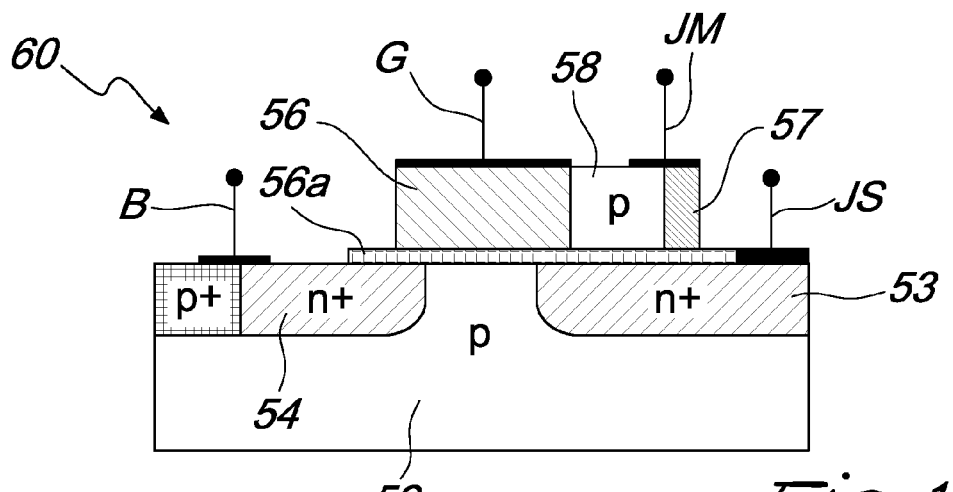
FIG. 15 is a view of a single-type or ST GDJ WJM nMOS in the bulk version, according to a sixth embodiment.

A transistor (50, 60) according to a fifth embodiment and a sixth embodiment of the invention is shown in FIGS. 13 and 15, respectively in the SOI and non-SOI versions.

The transistor 50 comprises a substrate 52 in which there are two regions 53, 54 which are heavily doped in the opposite manner with respect to the substrate 52, are mutually spaced and are provided with a respective body electrode B and a drain electrode (or source electrode, depending on the bias) JS.

The transistor 50 according to the fifth embodiment comprises also a buried oxide layer 51 below the two heavily doped regions 53 and 54.

A gate layer composed of a control layer 56 (made, for example, of polysilicon) and a layer of insulation 56a (for example silicon oxide) is deposited over the region comprised between the two heavily doped regions 53-54, so that a voltage applied between a gate electrode G connected to the control layer 56 and a body electrode B allows the creation of a minority carrier channel in the substrate 52, at the interface with the layer of insulation 56a.

On the insulation layer 56a, which also lies over at least one heavily doped region 53 of the two heavily doped regions 53-54, there is a deposited metal-semiconductor junction, in the form of an inverted Schottky diode, which is composed of a metallic region 57 (preferably of aluminum) and a layer of semiconductor material 58 doped substantially like the substrate 52 (i.e., p doped, in the case of FIG. 13). The layer 58 forms a junction with the control layer 56 of the gate and is superimposed on the first heavily doped region 53, although it is insulated electrically from said region by means of the insulating gate layer 56a.

The metal-semiconductor junction 57-58 is isolated electrically from the heavily doped regions 53 and 54 and from the substrate 52, thanks to the insulating gate layer 56a, and is provided with a respective electrode JM on its metallic region 57.

The transistor according to the fifth and sixth embodiment can be provided with the same fabrication method as a FD SOI MOS or of a bulk MOS, by removing chemically one of the silicon nitride spacers which usually surround the polysilicon control layer of the gate and replacing it with the Schottky structure shown in FIGS. 13 and 15. The transistor 50-60 produced by this operation is referenced here as GDJ ("Gate-Diode Junction") WJM.

To understand the operation of the transistor 50 of FIG. 13, assume that the body electrode B and the electrode JM of the metallic region 57 are connected to the ground and that the p doped layer 58 of the Schottky diode 57-58 is thin enough to be always depleted for any gate voltage $V_G > 0$.

In such conditions, if the gate voltage $V_G$ is brought to the high value ("1"), the nMOS structure 52-53-54 switches on, bringing to zero the potential of the electrode JS.

Vice versa, if the electrode JS is brought to the high value ("1"), electrons are attracted at the interface between the layer 58 of the Schottky diode and the insulating gate layer 56a, thus providing a conductive channel between the n$^+$ polysilicon, which constitutes the control layer 56 of the gate, and the metallic region 57.

If instead the electrodes G and JS are brought simultaneously to zero, both channels in the nMOS 52-53-54 and in the diode 57-58 disappear.

Figure 14:
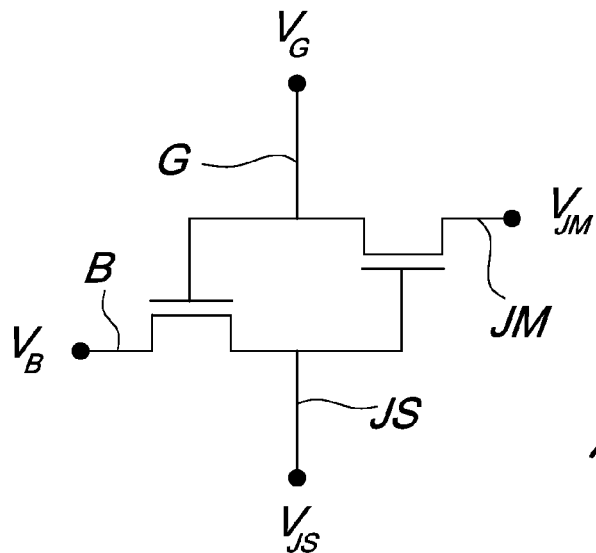
FIG. 14 is a view of a circuit which is equivalent to the GDJ WJM MOS of FIG. 13.

Based on what has been shown, at the electrical level a GDJ WJM transistor 50 according to the fifth embodiment is equivalent to a circuit composed of two FD nMOSs connected as in FIG. 14.

Actually, the condition imposed previously on the thickness of the semiconductor layer 58 of the Schottky diode, if the terminal JM is held to the ground, is not necessary, since it can be eliminated by short-circuiting the layer 58 with the metallic region 57 (for example by a p$^+$ implantation in the surface part of the silicon that constitutes the layer 58).

In fact, by doing so, the upper nMOS shown schematically in FIG. 14 becomes a normal bulk MOS, with the substrate connected to zero. Likewise, considering the lower nMOS of FIG. 14, if the body electrode B is always connected to the ground, it is possible to use, instead of an FD nMOS, a normal bulk MOS with the substrate short-circuited with B. A MOS device with such characteristics is, for example, the transistor 60 shown in FIG. 15.

The type of device just described with reference to FIGS. 13 and 15 (regardless of its SOI or bulk nature) can be designated STN ("Single-Type n-channel") GDJ, in order to distinguish it first of all from the dual version obtained by inverting all the dopings.

Figure 16:
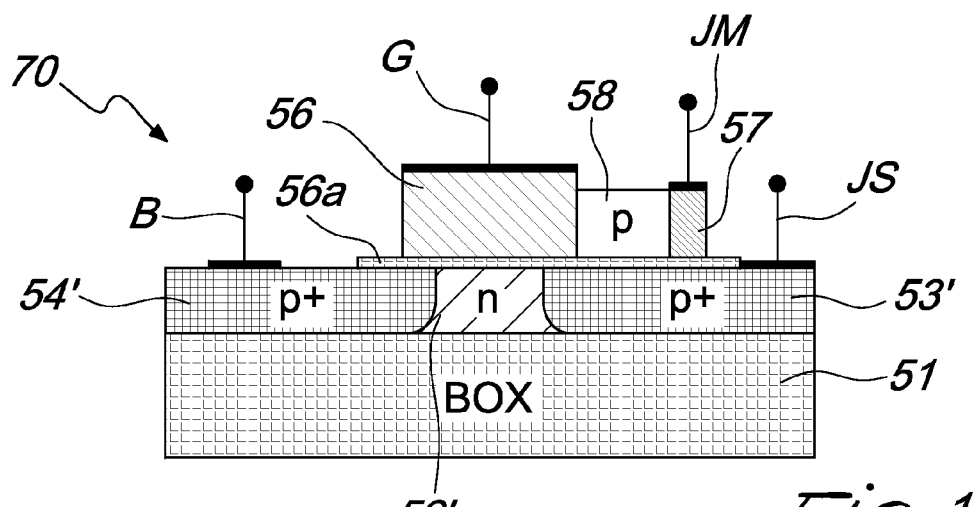
FIG. 16 is a view of a double-type (DT) GDJ WJM pMOS, according to a seventh embodiment of the invention.
Figure 19A:
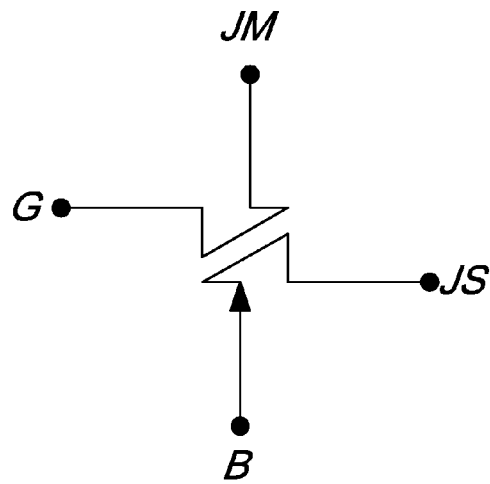
FIGS. 19a and 19b are preferred circuit symbols for n-channel and p-channel ST GDJ WJM MOSs, respectively.
Figure 19B:
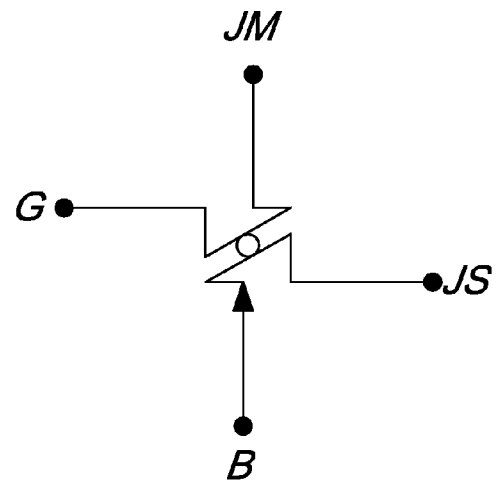
Figure 20A:
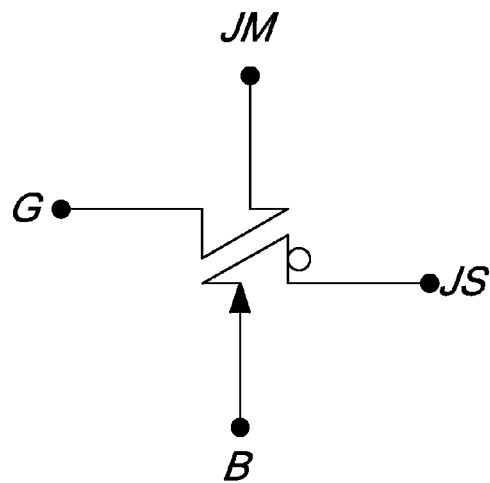
FIGS. 20a and 20b are preferred circuit symbols for n-channel and p-channel DT GDJ WJM MOSs, respectively.
Figure 20B:
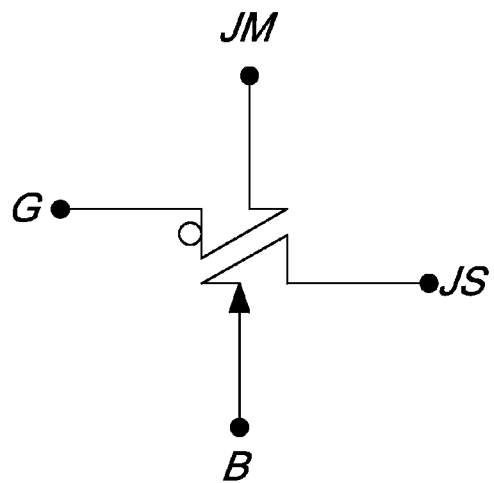

A variation of the STN GDJ transistor of FIG. 13 is shown in FIG. 16 and is designated here as DTP ("Double-type p-channel") GDJ. In detail, the DTP GDJ transistor 70 according to a seventh embodiment of the invention is obtained by inverting all the dopings of the region below the insulating gate layer 56a of the STN GDJ transistor 50, thus leaving unchanged the structure above said layer. In practice, the layer 58 of the Schottky diode remains p doped.

For the sake of simplicity, the various regions of the DTP GDJ transistor 70 of FIG. 16 have been designated by the same reference numerals used in the transistor 50 of FIG. 13, with the addition of a prime in the regions with doping which is inverted with respect to the doping of the corresponding regions of the GDJ transistor 50.

The operation of the DTP GJD transistor 70 is as follows. If the gate electrode G is brought to zero volts, the underlying pMOS structure (formed by the regions 53'-52'-54') switches on. The power-on of the pMOS brings the electrode JS to the supply voltage $V_{DD}$, consequently switching on the Schottky diode 57-58. The power-on of the Schottky diode 57-58 keeps the electrode G at zero volts, thus self-sustaining the system.

In these conditions, the pMOS 53'-52'-54' can be switched off only if the gate electrode G is brought to $V_{DD}$ and simultaneously the electrode JS is brought to zero. For this reason, at the electrical level, the DTP GDJ transistor 70 can be considered equivalent to the circuit structure of FIG. 17.

In an eighth embodiment of the invention, shown in FIGS. 18a and 18b, respectively in the SOI and non-SOI STN GDJ versions, the structure of the STN GDJ 50 is modified by replacing the metallic region 57 with a fifth region 59 of semiconductor material which is heavily doped in the opposite manner with respect to the doping of the layer of semiconductor material 58 in contact with the polysilicon of the gate control layer 56. In the case of an n-channel structure such as the one shown in FIGS. 18*a* and 18*b*, the fifth region 59 is n+ doped.

Of course, in addition to the STN/STP GDJ structures it is also possible to fabricate DTN/DTP GDJ structures in which a pn diode is used instead of the Schottky diode, in a manner similar to the one shown in FIG. 18.

In practice it has been found that the device according to the invention fully achieves the intended aim, since it integrates two transistors in a single component, maintaining the same area occupation as traditional MOSFETs. In this manner it is possible to reduce considerably the number of components required to fabricate integrated circuits, particularly SRAM memories, logic circuits and sequential circuits.

For example, a classic SRAM cell, which is known to require six MOS transistors (two bulk nMOS switches plus two inverters) to store a single bit, can be provided with a bulk nMOS (with the gate and source connected respectively to the word line WL and to the bit line BL) and two GDC nMOS according to the invention, which are connected to the drain of the bulk nMOS and have the electrodes JS and B connected respectively to $V_{DD}$ and to the ground.

The first GDC nMOS has the gate terminal G connected to the drain of the bulk nMOS and the electrode JM connected to the gate terminal of the other GDC nMOS, the electrode JM of which is, instead connected to the drain of the bulk nMOS. Let Q be the common drain node of the bulk nMOS and let $\overline{Q}$ be the common node between the terminal JM of the first GDC nMOS and the gate terminal of the second GDC nMOS: if Q is brought to the voltage $V_{DD}$ (i.e., if the bit "1" is written), the first GDC nMOS works under normal conditions and $\overline{Q}$ goes to zero. Accordingly, the second GDC nMOS enters inverse operation and maintains the node Q at the voltage $V_{DD}$. Of course, the opposite occurs if a bit "0" is written.

The transistor according to the invention can be fabricated by means of fabrication methods which are well known to the person skilled in the art and can be also deduced from the structures described earlier and shown in the Figures. For example, the DH WJM nMOS can be obtained by following the same process steps used to fabricate a traditional bulk nMOS before forming the MLO (Multi-Level Oxide) layer and then performing a lithography to delimit the space in which the junction JM will be fabricated, then performing an anisotropic chemical etching to remove the n+ silicon of the first region, then implanting boron with low energy and high concentration in the first region attacked chemically, then performing a second implantation in order to create a second n+ halo below all of the first p+ halo and, finally, depositing the aluminum in the first region.

The device thus conceived is susceptible of numerous modifications and variations, all of which are within the scope of the appended claims; all the details may further be replaced with other technically equivalent elements.

The disclosures in Italian Patent Application No. MI2007A000353 from which this application claims priority are incorporated herein by reference.

Where technical features mentioned in any claim are followed by reference signs, those reference signs have been included for the sole purpose of increasing the intelligibility of the claims and accordingly, such reference signs do not have any limiting effect on the interpretation of each element identified by way of example by such reference signs.

The invention claimed is:

1. A MOSFET transistor comprising:
(a) a substrate doped with a first type of dopant;
(b) a first region heavily doped with a second type of dopant that is opposite in electrical behavior from the first type of dopant embedded into the substrate so that the first region is in contact with the substrate;
(c) a second region, spaced apart from the first region so that a channel region forms between the first region and the second region;
(d) a metal region that is adjacent to and coplanar with the first region and disposed on a side of the first region that is opposite the channel region;
(e) a first halo region disposed adjacent to and under both the metal region and the first region, the first halo region embedded in the substrate and heavily doped with the first type of dopant;
(f) a second halo region disposed adjacent to and underneath the first halo region, the second halo region embedded in the substrate and heavily doped with the second type of dopant, the second halo region separated from the first region by the first halo region;
(g) a gate layer disposed on top of the first region and separated therefrom by an insulator layer, the channel and the second region;
(h) a JM electrode coupled to the metal region;
(i) a JS electrode coupled to the second region;
(j) a gate electrode coupled to the gate; and
(k) a base electrode coupled to a bottom portion of the substrate.

2. The transistor according to claim 1, wherein the metal region includes a metal that is selected to form an ohmic contact with an inversion region of said substrate between a junction between the metal region and the first region and the second region.

3. The transistor according to claim 1, wherein the substrate is p doped, the first halo region is p+ doped and the second halo region is n+ or n doped.

4. The transistor according to one or more of claim 1, wherein said substrate is n doped, said first halo is n+ doped and said second halo is p+ or p doped.

5. The transistor according to claim 1, wherein the gate layer comprises:
(a) an insulating gate layer in contact with a surface of the substrate in a region between the first region and the second region, and
(b) a control gate layer connected to the gate electrode, the control gate layer being made of a material selected from the group consisting of: n+ doped polysilicon, metal, p+ doped polysilicon.

* * * * *